(12) United States Patent
Ho et al.

(10) Patent No.: US 8,427,844 B2
(45) Date of Patent: *Apr. 23, 2013

(54) WIDEBODY COIL ISOLATORS

(75) Inventors: Dominique Ho, Singapore (SG); Julie Fouquet, Portola Valley, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 242 days.

This patent is subject to a terminal disclaimer.

(21) Appl. No.: 12/752,019

(22) Filed: Mar. 31, 2010

(65) Prior Publication Data

US 2010/0259909 A1    Oct. 14, 2010

Related U.S. Application Data

(63) Continuation-in-part of application No. 12/495,733, filed on Jun. 30, 2009, now Pat. No. 7,948,067, and a continuation-in-part of application No. 12/477,078, filed on Jun. 2, 2009, and a continuation-in-part of application No. 12/393,596, filed on Feb. 26, 2009, now Pat. No. 8,061,017, and a continuation-in-part of application No. 12/392,978, filed on Feb. 25, 2009, now Pat. No. 7,741,943, and a continuation-in-part of application No. 12/370,208, filed on Feb. 12, 2009, and a continuation-in-part of application No. 12/059, 979, filed on Mar. 31, 2008, and a continuation-in-part of application No. 12/059,747, filed on Mar. 31, 2008, now Pat. No. 7,852,186, and a continuation-in-part of application No. 11/512,034, filed on Aug. 28, 2006, now Pat. No. 7,791,900.

(51) Int. Cl.
*H01F 5/04* (2006.01)
*H01L 23/50* (2006.01)
*H01L 21/00* (2006.01)

(52) U.S. Cl.
USPC ........... 361/813; 336/200; 336/232; 257/676; 257/692; 257/725; 257/E21.494; 257/E23.011; 257/E23.043; 257/E23.052; 257/E23.079; 257/E25.03

(58) Field of Classification Search .................. 438/123; 257/676, 692, 725, E21.494, E23.011, E23.043, 257/E23.052, E23.079, E25.03; 361/813; 336/200, 232
See application file for complete search history.

(56) References Cited

U.S. PATENT DOCUMENTS

| 4,027,152 A | 5/1977 | Brown et al. |
| 4,236,086 A | 11/1980 | Hoebel |

(Continued)

FOREIGN PATENT DOCUMENTS

| CN | 1180277 | 4/1998 |
| CN | 1237081 | 12/1999 |

(Continued)

OTHER PUBLICATIONS

Integrated Transformer-Coupled Isolation, R. Kliger, Mar. 2003.

(Continued)

*Primary Examiner* — Evan Pert (57) ABSTRACT

Disclosed herein are various embodiments of widebody coil isolators containing multiple coil transducers, where integrated circuits are not stacked vertically over the coil transducers. The disclosed coil isolators provide high voltage isolation and high voltage breakdown performance characteristics in small packages that provide a high degree of functionality at a low price.

36 Claims, 6 Drawing Sheets

U.S. PATENT DOCUMENTS

| | | | |
|---|---|---|---|
| 4,494,100 A | 1/1985 | Stengel et al. | |
| 4,541,894 A | 9/1985 | Cassat | |
| 4,931,075 A | 6/1990 | Kuhn | |
| 5,015,972 A | 5/1991 | Cygan et al. | |
| 5,070,317 A | 12/1991 | Bhagat | |
| 5,312,674 A | 5/1994 | Haertling et al. | |
| 5,363,081 A | 11/1994 | Bando et al. | |
| 5,392,463 A | 2/1995 | Yamada | |
| 5,420,558 A | 5/1995 | Ito et al. | |
| 5,504,668 A | 4/1996 | Beyerlein | |
| 5,597,979 A | 1/1997 | Courtney et al. | |
| 5,659,462 A | 8/1997 | Chen et al. | |
| 5,693,971 A | 12/1997 | Gonzalez | |
| 5,716,713 A | 2/1998 | Zsamboky et al. | |
| 5,754,088 A | 5/1998 | Fletcher et al. | |
| 5,768,111 A | 6/1998 | Zaitsu | |
| 5,825,259 A | 10/1998 | Harpham | |
| 5,952,849 A | 9/1999 | Haigh | |
| 6,091,966 A | 7/2000 | Meadows | |
| 6,167,475 A | 12/2000 | Carr | |
| 6,175,293 B1 | 1/2001 | Hasegawa et al. | |
| 6,198,374 B1 | 3/2001 | Abel | |
| 6,215,377 B1 | 4/2001 | Douriet et al. | |
| 6,255,714 B1 | 7/2001 | Kossives et al. | |
| 6,300,617 B1 * | 10/2001 | Daughton et al. | 250/214.1 |
| 6,307,457 B1 | 10/2001 | Wissink et al. | |
| 6,320,532 B1 | 11/2001 | Diede | |
| 6,404,317 B1 | 6/2002 | Mizoguchi et al. | |
| 6,476,704 B2 | 11/2002 | Goff | |
| 6,489,850 B2 | 12/2002 | Heineke et al. | |
| 6,501,364 B1 | 12/2002 | Hui et al. | |
| 6,525,566 B2 | 2/2003 | Haigh et al. | |
| 6,538,313 B1 | 3/2003 | Smith | |
| 6,545,059 B1 * | 4/2003 | Fichou et al. | 516/199 |
| 6,556,117 B1 | 4/2003 | Nakao et al. | |
| 6,574,091 B2 | 6/2003 | Heineke et al. | |
| 6,661,079 B1 | 12/2003 | Bikulcius | |
| 6,686,825 B2 | 2/2004 | Tamezawa et al. | |
| 6,819,941 B2 | 11/2004 | Dening | |
| 6,856,226 B2 | 2/2005 | Gardner | |
| 6,859,130 B2 | 2/2005 | Nakashima et al. | |
| 6,867,678 B2 | 3/2005 | Yang | |
| 6,870,456 B2 | 3/2005 | Gardner | |
| 6,873,065 B2 * | 3/2005 | Haigh et al. | 307/412 |
| 6,888,438 B2 | 5/2005 | Hui et al. | |
| 6,891,461 B2 | 5/2005 | Gardner | |
| 6,903,578 B2 | 6/2005 | Haigh et al. | |
| 6,919,775 B2 | 7/2005 | Wendt et al. | |
| 6,922,080 B2 | 7/2005 | Haigh et al. | |
| 6,943,658 B2 | 9/2005 | Gardner | |
| 6,944,009 B2 | 9/2005 | Nguyen et al. | |
| 6,970,040 B1 | 11/2005 | Dening | |
| 7,016,490 B2 | 3/2006 | Beutler et al. | |
| 7,064,442 B1 | 6/2006 | Lane et al. | |
| 7,064,662 B2 | 6/2006 | Goggin | |
| 7,170,807 B2 | 1/2007 | Franzen et al. | |
| 7,171,739 B2 | 2/2007 | Yang et al. | |
| 7,177,370 B2 | 2/2007 | Zhang et al. | |
| 7,302,247 B2 * | 11/2007 | Dupuis | 455/280 |
| 7,376,116 B2 | 5/2008 | Rozenblitz et al. | |
| 7,376,212 B2 * | 5/2008 | Dupuis | 375/358 |
| 7,421,028 B2 * | 9/2008 | Dupuis | 375/258 |
| 7,425,787 B2 | 9/2008 | Larson, III | |
| 7,436,282 B2 | 10/2008 | Whittaker et al. | |
| 7,447,492 B2 * | 11/2008 | Dupuis | 455/333 |
| 7,460,604 B2 | 12/2008 | Dupuis | |
| 7,545,059 B2 * | 6/2009 | Chen et al. | 307/412 |
| 7,577,223 B2 * | 8/2009 | Alfano et al. | 375/362 |
| 7,650,130 B2 * | 1/2010 | Dupuis | 455/280 |
| 7,683,654 B2 * | 3/2010 | Chen et al. | 326/21 |
| 7,692,444 B2 * | 4/2010 | Chen et al. | 326/21 |
| 7,719,305 B2 * | 5/2010 | Chen | 326/21 |
| 7,737,871 B2 * | 6/2010 | Leung et al. | 341/100 |
| 7,738,568 B2 * | 6/2010 | Alfano et al. | 375/258 |
| 7,741,943 B2 | 6/2010 | Fouquet et al. | |
| 7,746,943 B2 * | 6/2010 | Yamaura | 375/260 |
| 7,821,428 B2 * | 10/2010 | Leung et al. | 341/101 |
| 7,856,219 B2 * | 12/2010 | Dupuis | 455/280 |
| 7,863,654 B2 * | 1/2011 | Lin | 257/211 |
| 7,920,010 B2 * | 4/2011 | Chen et al. | 327/307 |
| 7,932,799 B2 | 4/2011 | Loef et al. | |
| 7,948,067 B2 | 5/2011 | Ho | |
| 8,049,573 B2 * | 11/2011 | Alfano et al. | 333/1 |
| 8,061,017 B2 * | 11/2011 | Fouquet et al. | 29/606 |
| 8,064,872 B2 * | 11/2011 | Dupuis | 455/333 |
| 8,093,983 B2 * | 1/2012 | Fouquet et al. | 336/200 |
| 2002/0075116 A1 | 6/2002 | Peels et al. | |
| 2002/0110013 A1 | 8/2002 | Park et al. | |
| 2002/0135236 A1 * | 9/2002 | Haigh et al. | 307/91 |
| 2003/0042571 A1 * | 3/2003 | Chen et al. | 257/531 |
| 2004/0056749 A1 | 3/2004 | Kahlmann et al. | |
| 2005/0003199 A1 | 1/2005 | Takaya et al. | |
| 2005/0057277 A1 | 3/2005 | Chen et al. | |
| 2005/0077993 A1 | 4/2005 | Kanno et al. | |
| 2005/0094302 A1 | 5/2005 | Matsuzaki et al. | |
| 2005/0128038 A1 | 6/2005 | Hyvonen | |
| 2005/0133249 A1 | 6/2005 | Fujii | |
| 2005/0269657 A1 | 12/2005 | Dupuis | |
| 2005/0272378 A1 | 12/2005 | Dupuis | |
| 2006/0028313 A1 | 2/2006 | Strzalkowski et al. | |
| 2006/0095639 A1 | 5/2006 | Guenin et al. | |
| 2006/0152322 A1 | 7/2006 | Whittaker et al. | |
| 2006/0170527 A1 | 8/2006 | Braunisch | |
| 2006/0176137 A1 | 8/2006 | Sato et al. | |
| 2006/0214759 A1 | 9/2006 | Kawaraj | |
| 2006/0220775 A1 | 10/2006 | Ishikawa | |
| 2007/0080587 A1 | 4/2007 | Ruizenaar et al. | |
| 2007/0085447 A1 | 4/2007 | Larson, III | |
| 2007/0085632 A1 | 4/2007 | Larson, III et al. | |
| 2007/0086274 A1 | 4/2007 | Nishimura et al. | |
| 2007/0133923 A1 | 6/2007 | Han | |
| 2007/0281394 A1 | 12/2007 | Kawabe et al. | |
| 2007/0290784 A1 | 12/2007 | Nesse et al. | |
| 2008/0007382 A1 | 1/2008 | Snyder | |
| 2008/0030080 A1 * | 2/2008 | Chen et al. | 307/91 |
| 2008/0031286 A1 | 2/2008 | Alfano et al. | |
| 2008/0051158 A1 | 2/2008 | Male et al. | |
| 2008/0061631 A1 | 3/2008 | Fouquet et al. | |
| 2008/0174396 A1 | 7/2008 | Choi et al. | |
| 2008/0176362 A1 | 7/2008 | Sengupta et al. | |
| 2008/0179963 A1 | 7/2008 | Fouquet et al. | |
| 2008/0180206 A1 | 7/2008 | Fouquet | |
| 2008/0198904 A1 | 8/2008 | Chang | |
| 2008/0278255 A1 | 11/2008 | Harvey | |
| 2008/0278275 A1 | 11/2008 | Fouquet | |
| 2008/0284552 A1 | 11/2008 | Lim et al. | |
| 2008/0308817 A1 | 12/2008 | Wang et al. | |
| 2008/0311862 A1 | 12/2008 | Spina | |
| 2009/0072819 A1 | 3/2009 | Takahashi | |
| 2009/0180403 A1 | 7/2009 | Tudosoiu | |
| 2009/0243782 A1 | 10/2009 | Fouquet et al. | |
| 2009/0243783 A1 | 10/2009 | Fouquet et al. | |
| 2009/0268486 A1 | 10/2009 | Ljusev et al. | |
| 2010/0020448 A1 * | 1/2010 | Ng et al. | 361/1 |
| 2010/0052120 A1 | 3/2010 | Pruitt | |
| 2010/0176660 A1 * | 7/2010 | Fouquet et al. | 307/109 |
| 2010/0188182 A1 | 7/2010 | Fouquet et al. | |
| 2010/0259909 A1 * | 10/2010 | Ho et al. | 361/767 |
| 2010/0328902 A1 | 12/2010 | Ho et al. | |
| 2011/0075449 A1 * | 3/2011 | Fouquet | 363/21.01 |
| 2011/0095620 A1 * | 4/2011 | Fouquet et al. | 307/104 |

FOREIGN PATENT DOCUMENTS

| | | |
|---|---|---|
| DE | 19911133 | 10/2000 |
| DE | 10154906 | 5/2003 |
| EP | 1309033 | 5/2003 |
| EP | 1617337 | 1/2006 |
| GB | 2403072 | 6/2004 |
| JP | 57-39598 | 3/1982 |
| JP | 61-59714 | 3/1986 |
| JP | 3171705 | 7/1991 |
| JP | 06-53052 | 2/1994 |
| JP | 8-241955 | 9/1996 |
| JP | 10-150068 | 6/1998 |
| JP | 2000-508116 | 6/2000 |
| JP | 2001-258022 | 9/2001 |
| JP | 2002-260936 | 9/2002 |

| | | |
|---|---|---|
| JP | 2003-151829 | 5/2003 |
| JP | 2005-513824 | 5/2005 |
| JP | 2008-61236 | 3/2008 |
| WO | WO-9734349 | 3/1997 |
| WO | WO-2005/001928 | 6/2005 |
| WO | WO-2006033071 | 3/2006 |
| WO | WO-2007/053379 | 5/2007 |

OTHER PUBLICATIONS

U.S. Appl. No. 11/264,956, filed Nov. 1, 2005, Guenin et al.
U.S. Appl. No. 11/512,034, filed Aug. 28, 2006, Fouquet et al.
U.S. Appl. No. 11/747,092, filed May 10, 2007, Fouquet et al.
"Texas Instruments Dual Digital Isolators", *SLLS 755E* Jul. 2007.
Allflex Flexible Printed Circuit, "Design Guide", <http://www.allflexinc.com> Retrieved Feb. 12, 2009.
Analog Devices, , "iCoupler R Digital Isolation Products", 2005.
Analog Devices, Inc., , "iCoupler Digital Isolator ADuM1100 Data Sheet,", *Rev F* 2006.
Avago Technologies, "ACCL-9xxx 3.3V/5V High Speed CMOS Capacitive Isolator", *Preliminary Datasheet*. 2005.
Chen, Baoxing et al., "High Speed Digital Isolators Using Microscale On-Chip Transformers", Jul. 22, 2003.
Chen, Baoxing , "iCoupler Products with iso Power Technology", "Signal and Power Transfer Across Isolation Barrier Using Microtransformers" *Analog Devices* 2006.
Electronic Design, , "Planar Transformers make Maximum Use of Precious Board Space", *Penton Media, Inc., ED Online ID #7647* Mar. 9, 1998.

Fiercewireless, "Skyworks Introduces Industry's First Multi-band, Multi-mode TDD/TDD Power Amplifier for 4G LTE Applications Next-Generation TEC", Dec. 18, 2008 , 6 pages.
Krupka, J. et al., "Measurements of Permittivity, Loss Dielectric Tangent, and Resistivity of Float-Zone Silicon at Microwave Frequencies", *IEEE Abstract Microwave Theory and Techniques, IEEE Transaction on* vol. 54, Issue 11 Nov. 2006, 3995-4001.
Myers, John et al., "GMR Isolators", *Nonvalatile Electronics, Inc.* 1998.
Oljaca, Miroslav , "Interfacting the ADS1202 Modulator with a Pulse Transformer in Galvanically Isolated Systems", *SBAA 096* Jun. 2003 , 22 pages.
Payton Group International, , "Off the Shelf SMT Planar Transformers", <http://www.paytongroup.com> Retrieved Mar. 31, 2008.
Rogers Corporation, , "Advanced Circuit Materials, High Frequency Laminates and Flexible Circuit Materials", <http://www.rogerscorporation.com/mwu/translations/prod.htm> Mar. 2008.
Smith, Carl H. et al., "Chip-Size Magnetic Sensor Arrays", May 21, 2002.
Yang, Ru-Yuan , "Loss Characteristics of Silicon Substrate with Different Resistivities", *Microwave and Optical Technology Letters*, vol. 48, No. 9 Sep. 2006.
"Texas Instruments Dual Digital Isolators", *SLLS755E* 07/27.
Biersach, "Designing Medical Electrical Equipment to Meet Safety Certification and Regulatory Requirements", *Underwriters Laboratories*, 6 pages, Table 2 Jan. 2002.
Doane, et al., "Multichip Module Technologies and Alternatives—The Basics", *Section* 5.3.2. 1993 , 185.

\* cited by examiner

WIDEBODY COIL ISOLATORS

RELATED APPLICATIONS

This application claims priority and other benefits from, and is a continuation-in-part of each of the following patent applications: (a) U.S. patent application Ser. No. 11/512,034 filed Aug. 28, 2006 entitled "Galvanic Isolator" to Fouquet et al. (hereafter "the '034 patent application"); (b) U.S. patent application Ser. No. 12/059,747 filed Mar. 31, 2008 entitled "Coil Transducer with Reduced Arcing and Improved High Voltage Breakdown Performance Characteristics" to Fouquet et al. (hereafter "the '747 patent application"); (c) U.S. patent application Ser. No. 12/059,979 filed Mar. 31, 2008 entitled "Galvanic Isolators and Coil Transducers" to Fouquet et al. (hereafter "the '979 patent application"); (d) U.S. patent application Ser. No. 12/370,208 filed Feb. 12, 2009 entitled "High Voltage Hold-off Coil Transducer" to Fouquet et al. (hereafter "the '208 patent application"); (e) U.S. patent application Ser. No. 12/392,978 filed Feb. 25, 2009 entitled "Miniature Transformers Adapted for Use in Galvanic Isolators and the Like" to Fouquet et al. (hereafter "the '978 patent application"); (f) U.S. patent application Ser. No. 12/393,596 filed Feb. 26, 2009 entitled "Minimizing Electromagnetic Interference in Coil Transducers" to Fouquet et al. (hereafter "the '596 patent application"); (g) U.S. patent application Ser. No. 12/477,078 filed Jun. 2, 2009 entitled "Galvanic Isolator" to Gek Yong Ng. et al, (hereafter "the '078 patent application"); and U.S. patent application Ser. No. 12/495,733 filed Jun. 30, 2009 entitled "Coil Transducer Isolator Packages" (hereafter "the '733 patent application"). This application also hereby incorporates by reference herein in their respective entireties the foregoing '034, '747, '979, '208, '978, '596, '078 and '733 patent applications.

This application also hereby incorporates by reference herein U.S. patent application Ser. No. 12/751,971 filed on even date herewith entitled "Narrowbody Coil isolators" to Fouquet et al. (hereafter "the Fouquet patent application").

FIELD OF THE INVENTION

Various embodiments of the invention described herein relate to the field of data signal and power transformers or galvanic isolators and coil transducers, and more particularly to devices employing inductively coupled coil transducers to transmit and receive data and/or power signals across a dielectric or isolation barrier.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required.

Prior art magnetic devices typically achieve high voltage isolation by employing opposing inductively-coupled coils, usually require high power levels to (especially when high data rates are required), typically require the use of at least three separate integrated circuits or chips, and often are susceptible to electromagnetic interference ("EMI").

Prior art capacitive devices achieve voltage isolation by employing multiple pairs of transmitting and receiving electrodes, where for example a first pair of electrodes is employed to transmit and receive data, and a second pair of electrodes is employed to refresh or maintain the transmitted signals. Such capacitive devices typically exhibit poor high voltage hold-off or breakdown characteristics The design of small high speed galvanic isolators or coil transducers presents several formidable technical challenges, such difficulty in miniaturizing such devices while keeping manufacturing costs low, maintaining high voltage breakdown characteristics, and providing acceptable data or power transfer rates.

SUMMARY

In one embodiment, there is provided a coil isolator comprising a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, a first lead frame comprising a first IC die pad, and a second lead frame comprising a second IC die pad, wherein the first and second lead frames are separated by a gap, the first IC pad has a first IC attached thereto, the second IC pad has a second IC attached thereto, the coil transducer extends horizontally across the gap between the first and second lead frames and the first and second ends extend onto the first and second lead frames, no portions of the first and second lead frames are disposed vertically over or beneath any portions of the first and second coils, the coil wirebond pads are disposed vertically over or beneath the first and second lead frames, respectively, and the gap is filled substantially with at least one electrically non-conductive material having a voltage breakdown exceeding about 2,000 volts RMS.

In another embodiment, there is provided a coil isolator comprising a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, a substrate having at least one aperture disposed therethrough, the at least one aperture having at least one periphery, a first lead frame comprising an integrated circuit (IC) die pad, the first lead frame being located near the substrate but separated therefrom by a first gap, the first IC pad having a first IC attached thereto, a second lead frame comprising a second IC die pad, the second lead frame being located near the substrate but separated therefrom by a second gap, the second IC pad having a second IC attached thereto, wherein the coil transducer extends horizontally across the aperture and the first and second ends extend at least partially beyond the periphery and onto or beneath non-aperture portions of the substrate, the non-aperture portions of the substrate are not disposed vertically over or beneath any portions of the first and second coils, the coil wirebond pads are disposed vertically over or beneath non-aperture portions of the substrate, and the first and second gaps are filled substantially with at least one electrically non-conductive material having a voltage breakdown exceeding about 2,000 volts RMS.

In yet another embodiment, there is provided a coil isolator comprising a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, a first lead frame comprising an integrated circuit (IC) die pad, the first IC pad having a first IC attached thereto, a second lead frame comprising a second IC die pad, the second lead frame being located near the first lead frame and separated therefrom by a gap, the second IC pad having a second IC attached thereto, the second lead frame having at least one aperture disposed therethrough, the aperture having at least one periphery, wherein the coil transducer extends horizontally across the aperture and the first and second ends extend at least partially beyond the periphery and onto or beneath non-aperture portions of the second lead frame, the non-aperture portions of the second lead frame are not disposed vertically over or beneath any portions of the first and second coils, the coil wirebond pads are disposed vertically over or beneath non-aperture portions of the second lead frame, and the gap is filled substantially with at least one electrically non-conductive material having a voltage breakdown exceeding about 2,000 volts RMS.

In still another embodiment, there is provided a method of making a coil isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing a first integrated circuit (IC), a second IC, and first and second lead frames, the first lead frame including a first IC die pad, the second lead frame including a second IC pad, placing the first and second lead frames near one another such that the first and second lead frames are separated by a gap, attaching the first and second ICs to the first and second IC pads, respectively, attaching the coil transducer to the first and second lead frames such that the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and, second coils are disposed vertically over or beneath the first and second lead frames, respectively, and filling the gap substantially with at least one electrically non-conductive material having a voltage breakdown exceeding about 2,000 volts RMS.

In yet a further embodiment, there is provided a method of making a coil isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing a substrate having at least one aperture disposed therethrough, the aperture having at least one periphery, providing a first integrated circuit (IC) and a first lead frame comprising a first IC die pad, providing a second IC and a second lead frame comprising a second IC die pad, attaching the first IC to the first IC pad and the second IC to the second IC pad, attaching the coil transducer to the substrate such that the coil transducer extends horizontally across the aperture and at least portions of the first and second ends extend beyond the periphery and onto or beneath non-aperture portions of the substrate, non-aperture portions of the substrate are not disposed vertically over or beneath any portions of the first and second coils, and the wire bond pads of the first and second coils are disposed vertically over or beneath non-aperture portions of the substrate, placing the first lead frame near the substrate such that the first lead frame and the substrate are separated by a first gap, placing the second lead frame near the substrate such that the second lead frame and the substrate are separated by a second gap, and filling the first and second gaps substantially with at least one electrically non-conductive material having a voltage breakdown exceeding about 2,000 volts RMS.

In yet still another embodiment, there is provided a method of making a coil isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or op the second side, second leads extending between the second coil and wire bond pads corresponding thereto, the dielectric barrier being disposed between the first in and second coils, providing a first integrated circuit (IC) and a first lead frame comprising a first IC die pad, providing a second IC and a second lead frame comprising a second IC die pad having at least one aperture disposed therethrough, the aperture having at least one periphery, attaching the first IC to the first IC pad and the second IC to the second IC die pad, attaching the coil transducer to the second lead frame such that the coil transducer extends horizontally across the aperture and at least portions of the first and second ends extend beyond the periphery and onto or beneath non-aperture portions of the second lead frame, non-aperture portions of the second lead frame are not disposed vertically over or beneath any portions of the first and second coils, and the wire bond pads of the first and second coils are disposed vertically over or beneath non-aperture portions of the second lead frame, placing the first lead frame near the second lead frame such that the first lead frame and the second lead frame are separated by a gap, and filling the gap substantially with at least one electrically non-conductive material having a voltage breakdown exceeding about 2,000 volts RMS.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTION OF SOME PREFERRED EMBODIMENTS

In the following description, specific details are provided to impart a thorough understanding of the various embodiments of the invention. Upon having read and understood the specification, claims and drawings hereof, however, those skilled in the art will understand that some embodiments of the invention may be practiced without hewing to some of the specific details set forth herein. Moreover, to avoid obscuring the invention, some well known circuits, materials and methods finding application in the various, embodiments of the invention are not disclosed in detail herein.

In the drawings, some, but not all, possible embodiments of the invention are illustrated, and further may not be shown to scale.

The term "horizontal" as used herein means a plane substantially parallel to the conventional plane or surface of the dielectric barrier disclosed herein, regardless of its actual orientation in space. The term "vertical refers to a direction substantially perpendicular to the horizontal as defined above. Terms such as "on", "above," "below," "bottom," "top," "side," "sidewall," "higher," "lower," "upper," "over" and "under" are defined in respect of the horizontal plane discussed above.

In many semiconductor chip packages, part of a metal lead frame (typically the ground lead) widens within the package to provide a plane upon which other elements, such as silicon chips, may sit. Described and disclosed herein are various embodiments of a widebody package that can accommodate four full coil transducer isolators in a configuration that does not require stacking aside from the lead frame. The various embodiments of quad widebody packages disclosed herein can operate with low enough crosstalk between adjacent channels that data streams are not corrupted. According to some embodiments, the coil transducers are bidirectional, and therefore transmitter/receiver pairs may be spatially arranged and configured within the isolator or package as required. For example, the coil transducers in the isolator may be configured such that data travel from left to right in all four channels, or from left to right in two channels and right to left in the other two channels. Note that the transmitter and receiver sides of the various embodiments of coil isolator 5 disclosed herein may be reversed, the elements in any transmitter/receiver pair may be reversed, and that each metal pad or lead frame may be held at its local supply voltage rather than at ground potential, A signal isolator typically includes a transmitter, a coil transducer and a receiver. The transmitter conditions the incoming signal so that it will drive the transducer effectively. The coil transducer transmits the signal from one side of an isolation barrier to the other side. The receiver turns the signal from the far side of the isolation barrier into a (usually digital) signal replicating the input signal. For the isolator to consume the smallest amount of power, it is desirable for the coil transducer to transmit the signal from one side of the isolation barrier to the other side with high efficiency. However, the mutual inductance between two similar coils generally decreases with decreasing coil diameter. Careful attention must therefore be paid to the design of the coil transducer to obtain high efficiency in a widebody package. The isolator must also hold off large DC and transient voltages between the circuits on the two sides. See, for example, the foregoing '034, '747, '979, '208, '978, '596, '078, '733 and Fouquet patent applications.

A widebody package is not large, and much of the space available within the package must be used for parts and purposes other than the coil transducers contained therein. For example, the silicon transmitter and receiver consume a large fraction of the available "footprint", even if two channels are combined per chip (so that, for example, one chip may contain the transmitters for both channels and another chip may contain the receivers for both channels), as illustrated in some examples described and disclosed below. Allowances must be made for imprecise placement of parts within the package. Allowances must also be made for "squishout" of epoxy, if epoxy is used to attach the die within the package. Allowances must further be made for the Molding material surrounding the other elements within the package, so that the molding material will cover the elements within the package and prevent high voltage breakdown or other problems associated with interaction with the external environment.

As a result, the portion of the "footprint" remaining in the package for the coil transducers may be rather small. To avoid low efficiency from a too-small coil transducer, it is important to keep both the silicon chip sizes and the allowances for packaging small. High-accuracy die placement techniques can reduce allowances for imprecise placement. Using an adhesive tape rather than epoxy to fix elements within the package can be advantageous because the tape eliminates the need for epoxy "squishout" allowances, therefore enlarging the space available for coil transducers within the package. Such an approach is relatively straightforward to employ for coil transducers. An adhesive tape approach may also be employed to attach silicon chips to a lead frame as well, so long as requirements for heatsinking and possible electrical conduction from the bottom of the chip to the lead frames can be met.

In a traditional optical isolator package, in which an LED sits on an input lead frame face-to-face with a receiver chip mounted on an output lead frame, light from an LED is generally directed to a photodiode integrated in a receiver chip. Transparent dielectric material separates the LED from the receiver chip. While many optical isolator packages are capable of tolerating some variation in the thickness of the transparent dielectric material disposed between the LED and the receiver chip, coils in a magnetic coil transformer must be very accurately located with respect to one another. In some embodiments, the coils are formed photolithographically on a common insulating substrate or dielectric barrier. Even when the various components of a galvanic isolator are arranged and function optimally, they must be encapsulated by and surrounded with an electrically insulative molding material to prevent high voltage breakdown, which by way of example can occur around the outside of a coil transducer because air is a poor electrical insulator. If adhesion between the molding material and the various components of the galvanic isolator is not sufficiently good, the resulting air gaps can lead to high voltage breakdown.

When adhesion between an insulating molding material and the various components disposed within the package is less than ideal, some embodiments disclosed herein nevertheless will prevent high voltage breakdown.

Figure 1:
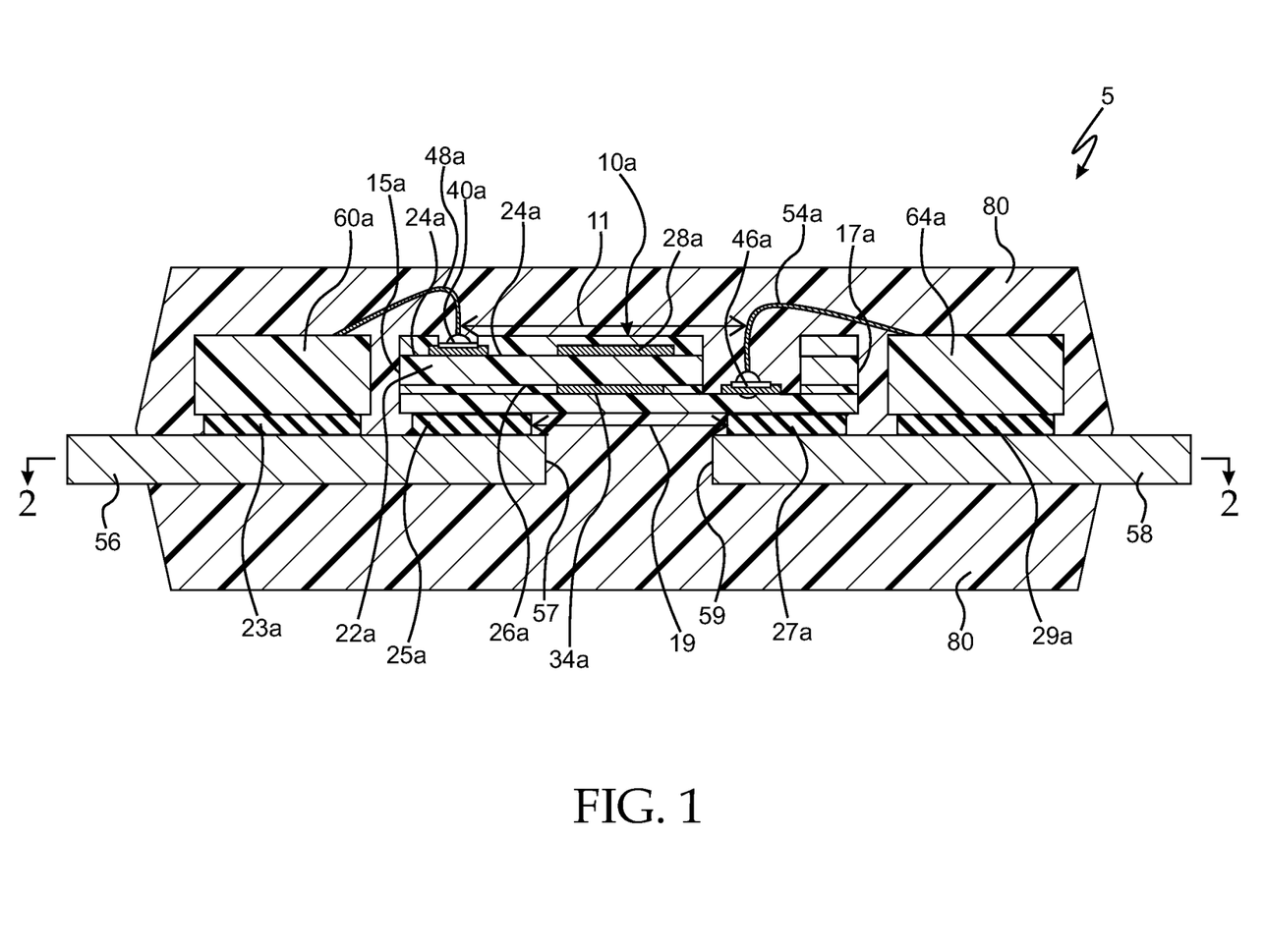
FIG. 1 shows a cross-sectional view according to one embodiment of a coil isolator.
Figure 2:
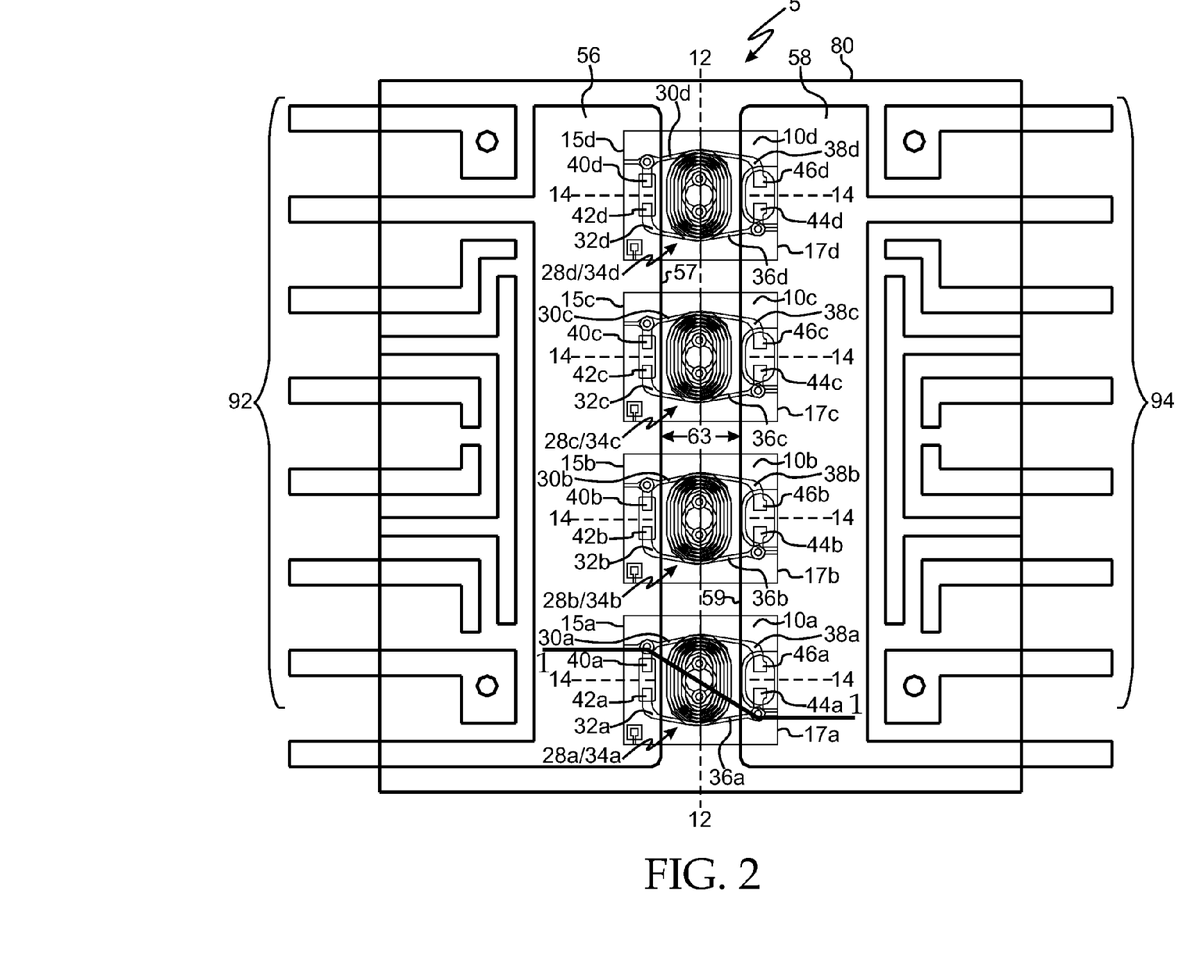
FIG. 2 shows a top plan view of the coil isolator of FIG. 1.

Referring now to FIGS. 1 and 2, there are shown cross-sectional and top plan views, respectively, of one embodiment of a coil isolator 5 according to a so-called "side-by-side lead frame" or "bridge" packaging approach characterized by lead frames 56 and 58 being located near one another (but not touching), with coil transducers 10a-10d extending across an intervening gap 63 disposed therebetween. According to one embodiment, a typical spacing of gap 63 is about 8 mils, although other suitable widths of gap 63 are certainly contemplated. Coil transducers 10a through 10d have opposing first and second ends 15a-15d and 17a-17d, respectively, each coil transducer comprising a dielectric barrier 22a-22d, such barriers have opposing first and second sides 24a-24d and 26a-26d, respectively (see FIG. 1). Dielectric barriers 22a-22d comprise an electrically insulating, non-metallic, non-semiconductor, low-dielectric-loss material. In each of coil transducers 10a-10d, first electrically conductive transmitter coils 28a-28d are disposed near or on first sides 24a-24d, where first leads 30a-30d and 32a-32d extend between first coils 28a-28d and corresponding wire bond pads disposed at ends thereof (see 40a-40d and 42a-42d, respectively, in FIG. 2). Also in each of coil transducers 10a-10d, second electrically conductive receiver coils 34a-34d are disposed near or on second sides 26a-26d, where second leads 36a-36d and 38a-38d extend between second coils 34a-34d and corresponding wire bond pads disposed at ends thereof (see 44a-44d and 46a-46d, respectively, in FIG. 2). Dielectric barriers 22a-22d are disposed between and separate the first and second coils 28a-28d and 34a-34d Adhesive tape 23a, 25a, 27a and 29a is preferably employed to attach ICs 60a-60d, coil transducers 10a-10d, and ICs 64a-64d to lead frames 56 and 58, although epoxy may also be used in a manner well known in the art. As discussed above, adhesive tape has the advantages of not resulting in "squishout" zones having potentially large space-consuming diameters, and not flowing to any appreciable degree. The adhesive tape is preferably a tape that is sticky on both sides. Alternatively, an adhesive or adhesive coating such as epoxy may be employed. If epoxy is used, allowances must be made for "squishout" so that the adjacent parts may be positioned closely to one another. Wafer backside coating techniques for die attach may also be used to reduce or eliminate squishout allowances. Wafer backside coating is a technique used widely in "stacked die" applications, where a silicon wafer is coated with a layer of B-stage epoxy before sawing, and then picked up and placed on a substrate. To avoid high power consumption, it is important to keep silicon chip sizes and allowances for packaging small so that coil transducers 10a-10d can be large enough to perform reasonably efficiently. High-accuracy die placement techniques can help reduce allowances for imprecise placement. Using adhesive tape or wafer backside coating techniques rather than epoxy to attach elements within coil isolator 5 can be advantageous because they essentially eliminate the need for space-robbing epoxy "squishout" allowances.

Lead frames 56 and 58 (and substrate 55 discussed below) are preferably formed of metal, and may therefore be formed quickly and inexpensively by, for example, stamping. Note further that the outline of encapsulating material 80 shown in FIG. 2 (as well as in FIGS. 4 and 6) delineates the approximate perimeter of electrically insulating overmolding material 80 that is emplaced around lead frames 56, 58, substrate 55, ICs 60a-60d, ICs 64a-64d. coil transducers 10a-10d, input leads 92, and output leads 94.

Figure 3:
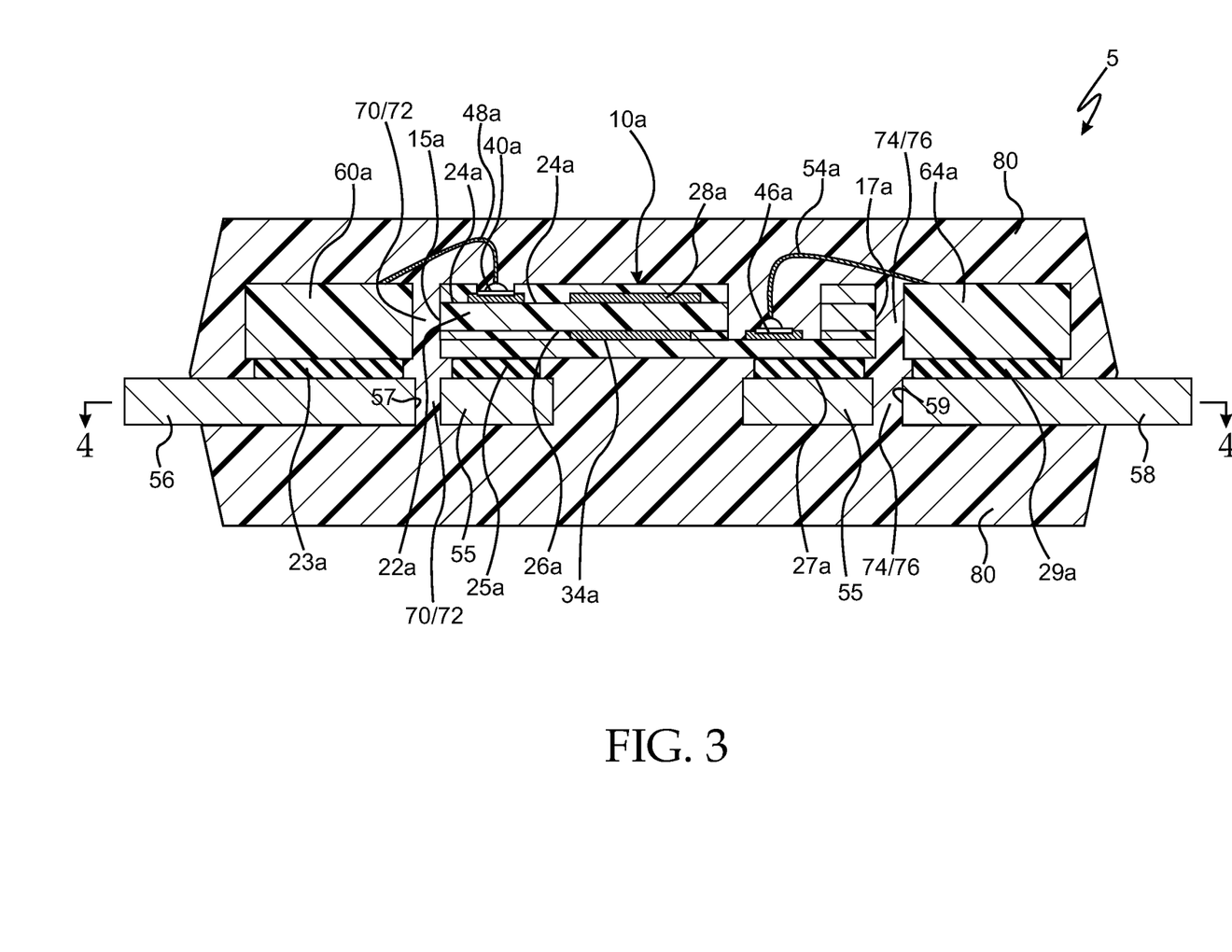
FIG. 3 shows a cross-sectional view according to another embodiment of a coil isolator.
Figure 4:
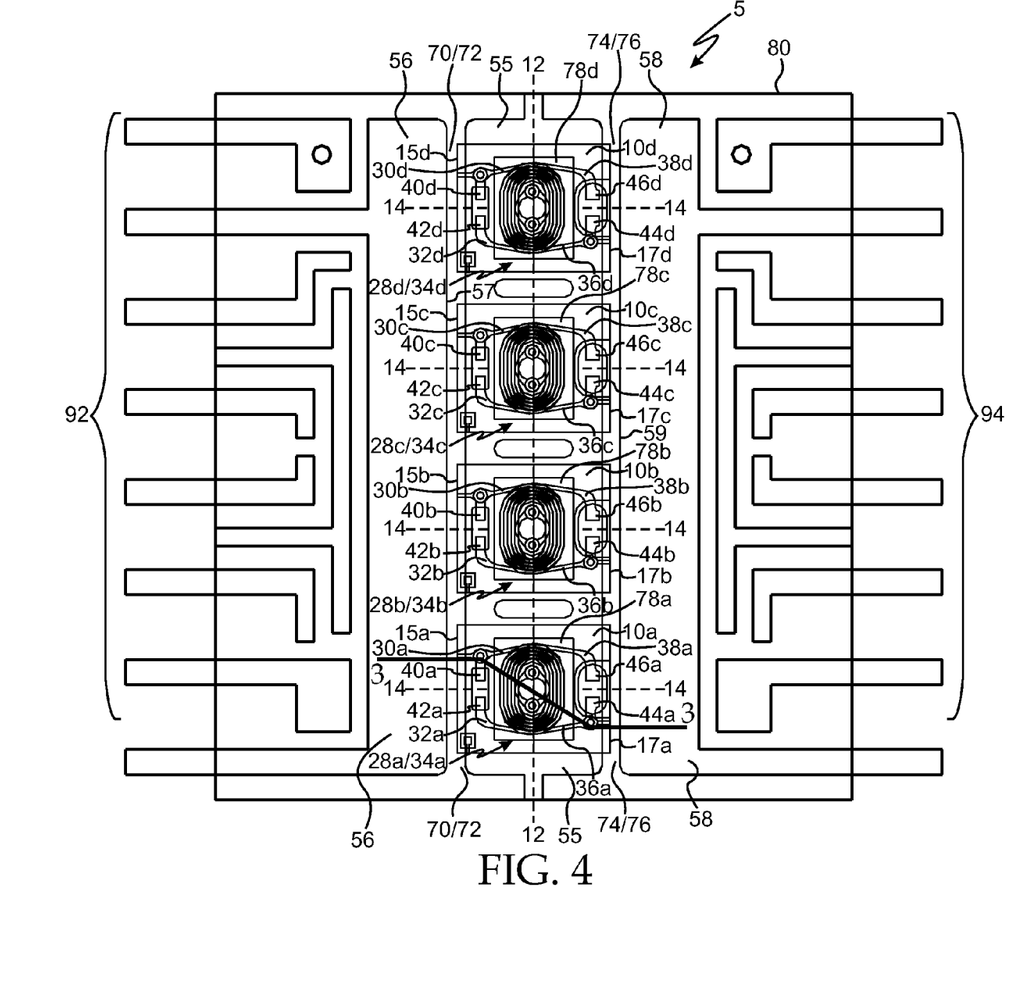
FIG. 4 shows a top plan view of the coil isolator of FIG. 3.
Figure 6:
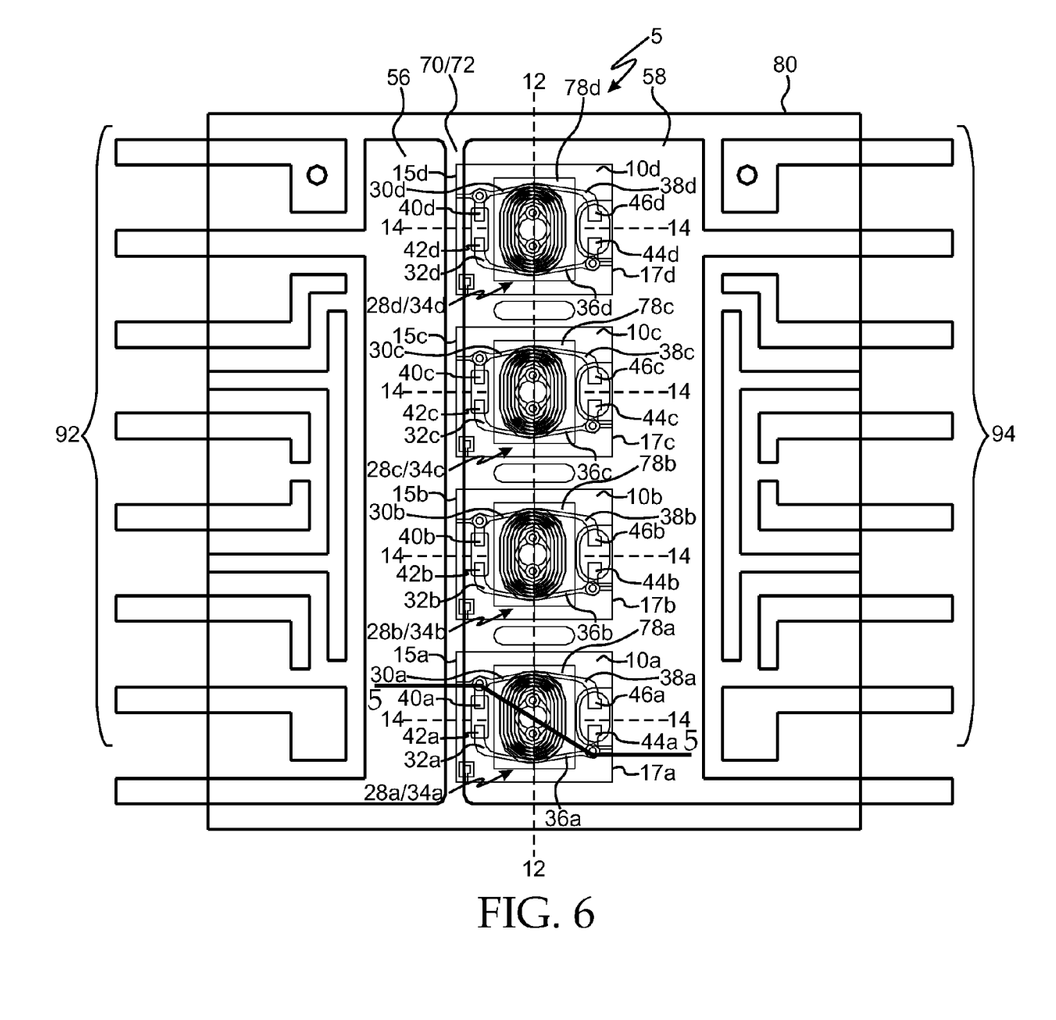
FIG. 6 shows a top plan view of the coil isolator of FIG. 5.

Encapsulating material 80 is shown in cross-section in FIGS. 1, 3 and 7 in further detail, and in one embodiment is a silica-bead-loaded epoxy or other suitable electrically insulating material such as an appropriate plastic or polymer. The silica beads in the epoxy have been discovered to help control undesired thermal expansion. Note further that those portions of leads 92 and 94, and first and second lead frames 56 and 58 which form pins for package 5, and which extend beyond the perimeter of material 80 shown in FIGS. 2, 4 and 6, are sawn off or otherwise removed after overmolding material 80 has encapsulated therein the various components and portions of package 5.

In whichever configuration they are employed, first and second lead frames 56 and 58 cannot touch one another, and must be electrically isolated from one another, to prevent shorting therebetween. The same is true with respect to first lead frame 56 and substrate 55, and second lead frame 58 and substrate 55, where touching is not permitted so as to prevent shorting.

Figure 5:
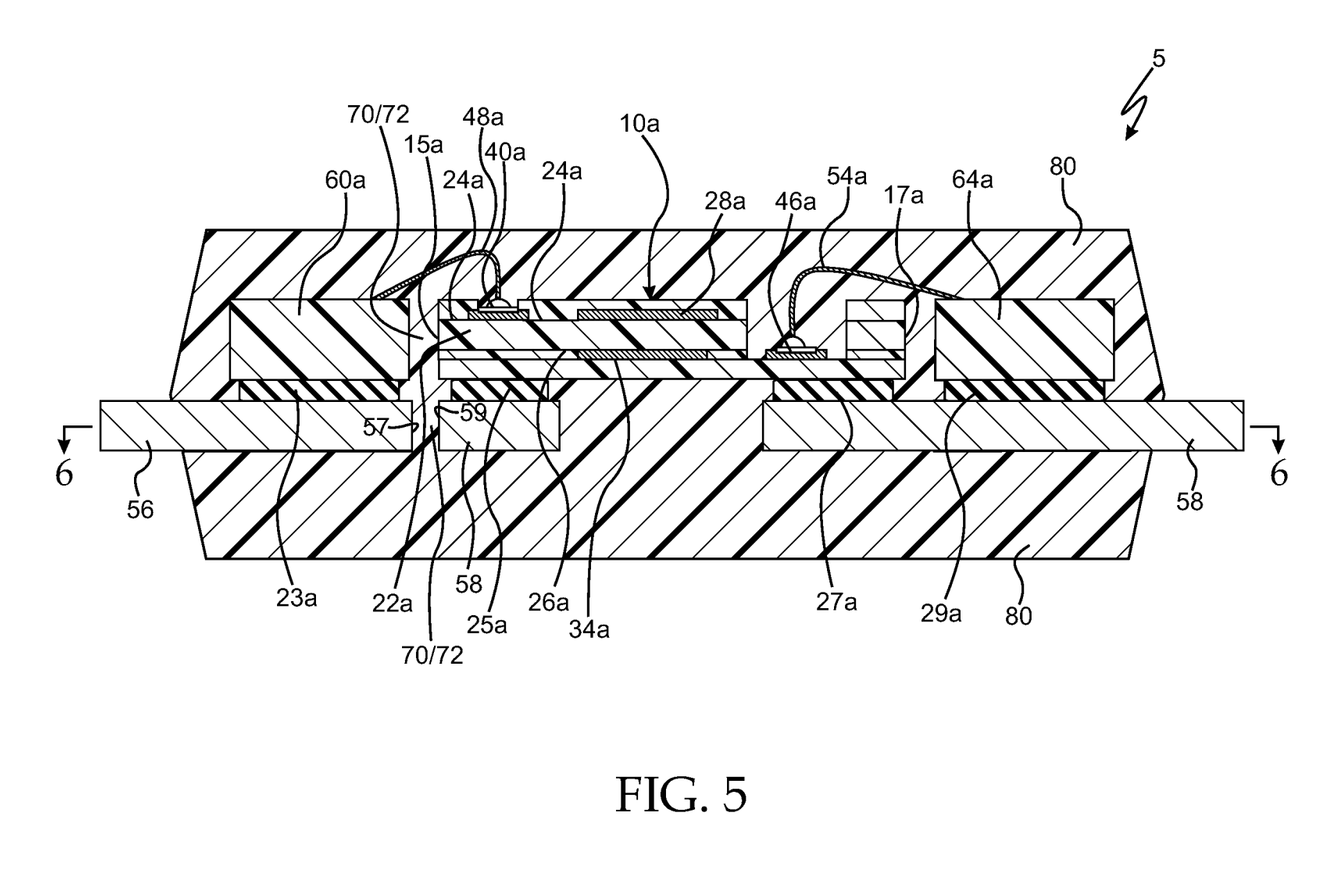
FIG. 5 shows a cross-sectional view according to yet another embodiment of a coil isolator.

As further shown in FIGS. 1 and 2, first and second lead frames 56 and 58 of coil isolator 5 are bridged by coil transducers 10a-10d, which extend horizontally between first and second lead frames 56 and 58, where at least portions of first and second ends 15a-15d and 17a-17d extend onto first and second lead frames 56 and 58. First and second lead frames 56 and 58 are separated from one another by gap 63, which in conjunction with the molding material selected to fill gap 63 is preferably selected to have a width sufficient to prevent high voltage breakdown from occurring between first lead frame 56 and second lead frame 58. To avoid clutter in the Figures, ICs 60a-60d and 64a-64d are not shown in FIGS. 2, 4 and 6, but are shown in the cross-sectional views of FIGS. 1, 3 and 5. For the same reason wire bonds 48a-48d, 50a-50d, 52a-54d and 54a-54d (which operably connect ICs 60a-60d and 64a-64d to coil transducers 10a-10d) are not shown in FIGS. 2, 4 and 6, but wire bonds 48a and 54a are shown in FIGS. 1, 3 and 5.

As further shown in FIGS. 1 and 2, first lead frame 56 includes first integrated circuit (IC) die pads upon which are mounted transmitter ICs 60a-60d. while second lead frame 58 includes second IC die pads upon which are mounted receiver ICs 64a-64d. According to one embodiment, first and second transmitter and receiver circuits 60a-60d and 64a-64d are integrated circuits, but may also assume other forms of transmitter and receiver circuitry known to those skilled in the art. Reference to FIGS. 1 and 2 also shows that edge portions 57 of first lead frame 56 are not disposed vertically beneath portions of first and second coils 28a-28d and 34a-34d, and that coil wirebond pads 40a-40d, 42a-42d, 44a-44d, and 46a-46d are disposed vertically over or beneath first and second lead frames 56 and 58, respectively.

The arrangement of coil transducers 10a-10d with respect to first and second lead frames 56 and 58 shown in FIGS. 1 and 2 has been discovered to improve the performance of coil isolator 5 by decreasing electromagnetic interaction between coil transducers 10a-10d and first lead frame 56 and second lead frame 58. Such an improvement in performance is due at least partially to coils 28a-28d and 34a-34d not overlapping vertically edge 57 of first lead frame 56 or second edge 59 of second frame 58. Lead frames 56 and 58 shown in FIGS. 1 and 2 provide firm, stable and robust underpinnings and structural supports for wire bonding operations undertaken with respect to wire bond pads 40a through 46d.

In the embodiment of coil isolator 5 shown in FIGS. 1 and 2, high voltage breakdown may also occur along paths 11 and 19. With respect to path 11 along the top side of coil transducers 10a-10d, high voltage shorting or arcing may occur along or near bonding wires 54a-54d and 48a-48d, or along or near any air gaps that might remain after molding material 80 has been disposed around the top surfaces of coil transducers 10a-10d. With respect to path 19 along the bottom side of coil transducers 10a-10d, high voltage shorting or arcing may also occur between inner edges 57 and 59 of first and second lead frames 56 and 58, respectively, or along or near any air gaps that might remain after molding material 80 has been disposed around the bottom surfaces of coil transducers 10a-10d.

Various embodiments of coil isolator 5 disclosed below provide solutions to the problems of electromagnetic interference and high voltage shorting or arcing described above.

Note that the embodiment of coil isolator 5 shown in FIGS. 1 and 2 may be modified such that no portions of first and second lead frames 56 and 58, including inner edges 57 and 59, are disposed vertically over or beneath any portions of first and second coils 28a-28d and 34a-34d, and such that coil wirebond pads 40a-46d are disposed vertically over or beneath portions of first and second lead frames 56 and 58, respectively. The first gap may also be filled substantially with at least one electrically non-conductive material having a voltage breakdown exceeding about 2,000 volts RMS. The first gap and the electrically non-conductive material disposed therein improve the performance of coil isolator 5 due to an increase in electromagnetic resistance occurring between lead frames 56 and 58, which also results in the elimination or reduction of shorting, arcing or high voltage breakdown paths between such components.

Referring now to FIGS. 3 and 4, there are shown cross-sectional and top plan views, respectively, according to another embodiment of coil isolator 5, a so-called "floating island" packaging approach characterized by centrally located substrate 55 being disposed between, but separated from, first lead frame 56 and second lead frame 58 by first gap 70 and second gap 74, respectively. As further shown in FIGS. 3 and 4, lead frames 56 and 58 are disposed to either side of centrally disposed substrate 55 such that inner edge 57 of first lead frame 56, and inner edge 59 of second lead frame 58, face towards substrate 55, but are separated therefrom by first gap 70 and first gap filling material 72, and second gap 74 and second gap filling material 76, respectively.

As further shown in FIGS. 3 and 4, substrate 55 comprises a plurality of apertures 78a-78d, one for each of coil transducers 10a-10d, each of which coil transducers extends horizontally across its corresponding aperture such that the first and second ends 15a-15d and 17a-17d extend at least partially beyond the periphery of each aperture and onto or beneath non-aperture portions of substrate 55. As further shown in FIG. 3, the non-aperture portions of substrate 55 are not disposed vertically over or beneath any portions of first and second coils 28a and 34a, and coil wirebond pads 40a-46a are disposed vertically over or beneath non-aperture portions of substrate 55. First and second gaps 70 and 74 are filled substantially with at least one electrically non-conductive material having a voltage breakdown exceeding about 2,000 volts RMS, which according to one embodiment is the same material employed to encapsulate the various components of coil isolator 5. Note that the regions of package 5 located beneath the centers of coil transducers 10a-10d intentionally contain no metal so as to minimize electromagnetic interference and reduce the probability of shorting, arcing or high voltage breakdown.

The arrangement of coil transducers 10a-10d with respect to first and second lead frames 56 and 58 and substrate 55 shown in FIGS. 3 and 4 increases the performance of coil isolator 5 by increasing electromagnetic resistance between coil transducers 10a-10d and first and second lead frames 56 and 58, and by providing a firm, stable and robust underpinning and structural support for wire bonding operations undertaken with respect to wire bond pads 40a through 46d. High voltage shorting and arcing path 19 shown in FIG. 1 is essentially eliminated in the embodiment of coil isolator 5 shown in FIGS. 3 and 4. Vertically-oriented gaps 70 and 74 are filled with electrically insulating materials 72 and 76, which prevent high voltage breakdown, shorting and arcing between substrate 55 and first and second lead frames 56 and 58.

Referring now to FIGS. 5 and 6, there are shown cross-sectional and top plan views, respectively, according to yet another embodiment of coil isolator 5, a so-called "extended lead frame" packaging approach characterized by apertures 78a-78d being located in second frame 58, where second lead frame is separated from first lead frame 56 by gap 70 and gap filling material 72. As further shown in FIGS. 5 and 6, lead frames 56 and 58 are positioned near one another such that inner edges 57 of first lead frame 56, and inner edge 59 of second lead frame 58, face towards one another across vertically-oriented gap 70.

As shown in FIGS. 5 and 6, second lead frame 58 comprises a plurality of apertures 78a-78d, one for each of coil transducers 10a-10d, each of which extends horizontally across its corresponding aperture such that the first and second ends 15a-15d and 17a-17d extend at least partially beyond the periphery of each aperture and onto or beneath non-aperture portions of second lead frame 58. As further shown in FIG. 5, the non-aperture portions of second lead frame 58 are not disposed vertically over or beneath any portions of first and second coils 28a and 34a, and coil wirebond pads 40a-46a are disposed vertically over or beneath non-aperture portions of second lead frame 58. Vertically-oriented gap 70 is filled substantially with at least one electrically non-conductive material having a voltage breakdown exceeding about 2,000 volts RMS, which according to one embodiment is the same material employed to encapsulate the various components of coil isolator 5. Note that according to one embodiment, the regions of package 5 located beneath the centers of coil transducers 10a-10d intentionally contain no metal.

The arrangement of coil transducers 10a-10d with respect to first and second lead frames 56 and 58 shown in FIGS. 5 and 6 increases the performance of system 5 by increasing electromagnetic resistance between coil transducers 10a-10d and first and second lead frames 56 and 58, and by providing a firm, stable and robust underpinning and structural support for wire bonding operations undertaken with respect to wire bond pads 40a through 46d. High voltage shorting and arcing path 19 shown in FIG. 1 is essentially eliminated in the embodiment of coil transducer 5 shown in FIGS. 5 and 6. Vertically-oriented gap 70 is filled with electrically insulating material 72, which prevents high voltage breakdown, shorting and arcing between first lead frame 56 and second lead frames 58.

Note that first lead frame 56 instead of second lead frame 58 may be configured to extend beneath coil transducer 10*a*. Doing so limits the extent of lead frame 58 that is employed to support IC 64*a*, which in turn can result in reducing the voltage holdoff demands on the insulating layer at the bottom of coil transducer 10*a* when lead frame 56 supporting coil transducer 10*a* is at a voltage close to that of the coil located nearest thereto it (e.g., coil 34*a* in FIG. 1).

Note that the various embodiments of coil isolator 5 shown in FIGS. 1, 2, 3, 4, 5 and 6 may comprise one or more of first ICs 60*a*-60*d* comprising transmitter circuits and having transmitter output terminals, the transmitter output terminals being operably connected to first coils 28*a*-28*d* through the wire bond pads corresponding thereto: Such transmitter circuits may be configured to provide differential output signals. Second ICs 64*a*-64*d* may comprise receiver circuits and have receiver input terminals, the receiver input terminals being operably connected to second coils 34*a*-34*d* through the wire bond pads corresponding thereto. Such receiver circuits may be configured to receive differential input signals. First and second coils 28*a*-28*d* and 34*a*-34*d* are preferably spatially arranged and configured respecting one another such that at least one, of power and data signals may be transmitted by the first coils to the second coils across dielectric barriers 22*a*-22*d*.

Note further that in some embodiments each pair of transmitting and receiving coils 28*a*/34*a*, 28*b*/34*b*, 28*c*/34*c* and 28*d*/34*d* has, in combination, at least five turns, at least eight turns, at least ten turns, at least twenty turns, or more than twenty turns. In some signaling embodiments, fewer coils turns (such as less than twenty turns) may be employed in conjunction with coil trace widths ranging between about 20 microns and about 40 microns. In some power embodiments, more than twenty coil turns may be employed in conjunction with coil trace widths ranging between about 40 microns and about 100 microns.

Dielectric barriers 22*a*-22*d* may comprise one or more of fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, plastic, a polymer or combination of polymers containing ceramic beads or particles, ceramic/polymer blends, mixes and combinations, KAPTON™ material manufactured by DuPont Corporation™, and THERMAL CLAD™ dielectric materials manufactured the Bergquist Company™ (such as those having layers containing "High Power Lighting" or HPL dielectric material).

According to some embodiments of coil isolator 5, a breakdown voltage between coil transducers 10*a*-10*d* and first ICs 60*a*-60*d* across gap 70, or between coil transducers 10*a*-10*d* and second ICs 64*a*-64*d* across gap 74, may exceed about 2,000 volts RMS when applied over a time period of about one minute, exceed about 2,000 volts RMS when applied over a time period of about six minutes, or exceed about 2,000 volts RMS when applied over a time period of 24 hours. Alternatively, a breakdown voltage between coil transducers 10*a*-10*d* and first ICs 60*a*-60*d* across gap 70, or between coil transducers 10*a*-10*d* and second ICs 64*a*-64*d* across the gap 74, may exceed about 5,000 volts RMS when applied over a time period of about one minute, exceed about 5,000 volts RMS when applied over a time period of about six minutes, or exceed about 5,000 volts RMS when applied over a time period of 24 hours.

As shown in FIGS. 1, 3 and 5, coil transducers 10*a*-10*d* and at least portions of the first and second lead frames 56 and 58 are encapsulated with a molding material 80, which in a preferred embodiment is a silica-bead-loaded epoxy. Note further, and as shown in FIGS. 2, 4 and 6, in some embodiments wire bond pads 40*a*-46*d* for coils 28*a*-34*d* of coil transducers 10*a*-10*d* are located on both sides of major axis 12 of such coil transducers.

A length L of each coil transducer 10 between first and second ends 15 and 17 may be less than about 2 mm. A width W of each coil transducer 10 may be less than about 1.5 mm. According to some embodiments, coil isolator 5 forms a package including four coil transducers 10*a*-10*d*, first and second lead frames 56 and 58 and optionally substrate 55, and transmitter and receiver circuits 60*a*-60*d* and 64*a*-64*d*, where the package has a length less than about 12 mm, less than about 20 mm, or less than about 30 mm, and has a width less than about 6 mm, less than about 10 mm, or less than about 20 mm.

Included within the scope of the present invention are methods of making and having made, and using, the various components, devices and systems described herein.

For example, in one embodiment there is provided a method of making a coil isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing a first integrated circuit (IC), a second IC, and first and second lead frames, the first lead frame including a first IC die pad, the second lead frame including a second IC pad, placing the first and second lead frames near one another such that the first and second lead frames are separated by a gap, attaching the first and second ICs to the first and second IC pads, respectively, attaching the coil transducer to the first and second lead frames such that the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively, and filling the gap substantially with at least one electrically non-conductive material having a voltage breakdown exceeding about 2,000 volts RMS.

According to another example, there is provided a method of making a coil isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing a substrate having at least one aperture disposed therethrough, the aperture having at least one periphery, providing a first integrated circuit (IC) and a first lead frame comprising a first IC die pad, providing a second IC and a second lead frame comprising a second IC die pad, attaching the first IC to the first IC pad and the second IC to the second IC pad, attaching the coil transducer to the substrate such that the coil transducer extends horizontally across the aperture and at least portions of the first and second ends extend beyond the periphery and onto or beneath non-aperture portions of the substrate, non-aperture portions of the substrate are not disposed vertically over or beneath any portions of the first and second coils, and the wire bond pads of the first and second coils are disposed vertically over or beneath non-aperture portions of the substrate, placing the first lead frame near the substrate such that the first lead frame and the substrate are separated by a first gap, placing the second lead frame near the substrate such that the second lead frame and the substrate are separated by a second gap, and filling the first and second gaps substantially with at least one electrically non-conductive material having a voltage breakdown exceeding about 2,000 volts RMS.

In yet a further example, there is provided a method of making a colt isolator comprising providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils, providing a first integrated circuit (IC) and a first lead frame comprising a first IC die pad, providing a second IC and a second lead frame comprising a second IC die pad having at least one aperture disposed therethrough, the aperture having at least one periphery, attaching the first IC to the first IC pad and the second IC to the second IC die pad, attaching the coil transducer to the second lead frame such that the coil transducer extends horizontally across the aperture and at least portions of the first and second ends extend beyond the periphery and onto or beneath non-aperture portions of the second lead frame, non-aperture portions of the second lead frame are not disposed vertically over or beneath any portions of the first and second coils, and the wire bond pads of the first and second coils are disposed vertically over or beneath non-aperture portions of the second lead frame, placing the first lead frame near the second lead frame such that the first lead frame and the second lead frame are separated by a gap, and filling the gap substantially with at least one electrically non-conductive material having a voltage breakdown exceeding about 2,000 volts RMS.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A coil isolator, comprising:
a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
a first lead frame comprising a first IC die pad, and
a second lead frame comprising a second IC die pad;
wherein the first and second lead frames are separated by a gap, the first IC pad has a first IC attached thereto, the second IC pad has a second IC attached thereto, the coil transducer extends horizontally across the gap between the first and second lead frames and the first and second ends extend onto the first and second lead frames, no portions of the first and second lead frames are disposed vertically over or beneath any portions of the first and second coils, the coil wirebond pads are disposed vertically over or beneath the first and second lead frames, respectively, and the gap is filled substantially with at least one electrically non-conductive material having a voltage breakdown exceeding about 2,000 volts RMS.

2. The coil isolator of claim 1, wherein the coil transducer is a flex circuit.

3. The coil isolator of claim 1, wherein the first IC comprises a transmitter circuit and has transmitter output terminals, the transmitter output terminals being operably connected to the first coil through the wire bond pads corresponding thereto.

4. The coil isolator of claim 1, wherein the second IC comprises a receiver circuit and has receiver input terminals, the receiver input terminals being operably connected to the second coil through the wire bond pads corresponding thereto.

5. The coil isolator of claim 1, wherein the first and second coils are spatially arranged and configured respecting one another such that at least one of power and data signals may be transmitted by the first coil to the second coil across the dielectric barrier.

6. The coil isolator of claim 1, wherein the first and second coils, in combination, have at least five turns, at least eight turns, at least ten turns, or at least twenty turns.

7. The coil isolator of claim 1, wherein the dielectric barrier comprises fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, plastic, a polymer or combination of polymers containing ceramic beads or particles, or ceramic/polymer blends, mixes and combinations.

8. The coil isolator of claim 1, wherein a breakdown voltage between the coil transducer and the first IC or second IC across the gap exceeds about 2,000 volts RMS when applied over a time period of about one minute, exceeds about 2,000 volts RMS when applied over a time period of about six minutes, or exceeds about 2,000 volts RMS when applied over a time period of 24 hours.

9. The coil isolator of claim 1, wherein the coil transducer and at least portions of the first and second lead frames are encapsulated with a molding material comprising silica-loaded epoxy.

10. The coil isolator of claim 1, wherein wire bond pads for coils of the coil transducer are located on both sides of a major axis of the coil transducer.

11. A coil isolator, comprising:
a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
a substrate having at least one aperture disposed therethrough, the at least one aperture having at least one periphery;
a first lead frame comprising an integrated circuit (IC) die pad, the first lead frame being located near the substrate but separated therefrom by a first gap, the first IC pad having a first IC attached thereto;
a second lead frame comprising a second IC die pad, the second lead frame being located near the substrate but separated therefrom by a second gap, the second IC pad having a second IC attached thereto,
wherein the coil transducer extends horizontally across the aperture and the first and second ends extend at least partially beyond the periphery and onto or beneath non-aperture portions of the substrate, the non-aperture portions of the substrate are not disposed vertically over or beneath any portions of the first and second coils, the coil wirebond pads are disposed vertically over or beneath non-aperture portions of the substrate, and the first and second gaps are filled substantially with at least one electrically non-conductive material having a voltage breakdown exceeding about 2,000 volts RMS.

12. The coil isolator of claim 11, wherein the coil transducer is a flex circuit.

13. The coil isolator of claim 11, wherein the first IC comprises a transmitter circuit and has transmitter output terminals, the transmitter output terminals being operably connected to the first coil through the wire bond pads corresponding thereto.

14. The coil isolator of claim 11, wherein the second IC comprises a receiver circuit and has receiver input terminals, the receiver input terminals being operably connected to the second coil through the wire bond pads corresponding thereto.

15. The coil isolator of claim 11, wherein the first and second coils are spatially arranged and configured respecting one another such that at least one of power and data signals may be transmitted by the first coil to the second coil across the dielectric barrier.

16. The coil isolator of claim 11, wherein the first and second coils, in combination, have at least five turns, at least eight turns, at least ten turns, or at least twenty turns.

17. The coil isolator of claim 11, wherein the dielectric barrier comprises fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, or plastic.

18. The coil isolator of claim 11, wherein a breakdown voltage between the coil transducer and the first IC or second IC across the gap exceeds about 2,000 volts RMS when applied over a time period of about one minute, exceeds about 2,000 volts RMS when applied over a time period of about six minutes, or exceeds about 2,000 volts RMS when applied over a time period of 24 hours.

19. The coil isolator of claim 14, wherein the coil transducer and at least portions of the first and second lead frames are encapsulated with a molding material comprising silica-loaded epoxy.

20. The coil isolator of claim 14, wherein wire bond pads for coils of the coil transducer are located on both sides of a major axis of the coil transducer.

21. A coil isolator, comprising:
a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
a first lead frame comprising an integrated circuit (IC) die pad, the first IC pad having a first IC attached thereto;
a second lead frame comprising a second IC die pad, the second lead frame being located near the first lead frame and separated therefrom by a gap, the second IC pad having a second IC attached thereto, the second lead frame having at least one aperture disposed therethrough, the aperture having at least one periphery;
wherein the coil transducer extends horizontally across the aperture and the first and second ends extend at least partially beyond the periphery and onto or beneath non-aperture portions of the second lead frame, the non-aperture portions of the second lead frame are not disposed vertically over or beneath any portions of the first and second coils, the coil wirebond pads are disposed vertically over or beneath non-aperture portions of the second lead frame, and the gap is filled substantially with at least one electrically non-conductive material having a voltage breakdown exceeding about 2,000 volts RMS.

22. The coil isolator of claim 21, wherein the coil transducer is a flex circuit.

23. The coil isolator of claim 21, wherein the first IC comprises a transmitter circuit and has transmitter output terminals, the transmitter output terminals being operably connected to the first coil through the wire bond pads corresponding thereto.

24. The coil isolator of claim 21, wherein the second IC comprises a receiver circuit and has receiver input terminals, the receiver input terminals being operably connected to the second coil through the wire bond pads corresponding thereto.

25. The coil isolator of claim 21, wherein the first and second coils are spatially arranged and configured respecting one another such that at least one of power and data signals may be transmitted by the first coil to the second coil across the dielectric barrier.

26. The coil isolator of claim 21, wherein the first and second coils, in combination, have at least five turns, at least eight turns, at least ten turns, or at least twenty turns.

27. The coil isolator of claim 21, wherein the dielectric barrier comprises fiberglass, glass, ceramic, polyimide, polyimide film, a polymer, an organic material, a flex circuit material, epoxy, epoxy resin, a printed circuit board material, PTFE and glass, PTFE and ceramic, glass and ceramic, thermoset plastic, or plastic.

28. The coil isolator of claim 21, wherein a breakdown voltage between the coil transducer and the first IC across the first gap, or between the coil transducer and the second IC across the second gap, exceeds about 2,000 volts RMS when applied over a time period of about one minute, exceeds about 2,000 volts RMS when applied over a time period of about six minutes, or exceeds about 2,000 volts RMS when applied over a time period of 24 hours.

29. The coil isolator of claim 21, wherein the coil transducer and at least portions of the first and second lead frames are encapsulated with a molding material comprising silica-loaded epoxy.

30. The coil isolator of claim 21, wherein wire bond pads for coils of the coil transducer are located on both sides of a major axis of the coil transducer.

31. A method of making a coil isolator, comprising:
providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
providing a first integrated circuit (IC), a second IC, and first and second lead frames, the first lead frame including a first IC die pad, the second lead frame including a second IC pad;
placing the first and second lead frames near one another such that the first and second lead frames are separated by a gap;
attaching the first and second ICs to the first and second IC pads, respectively;
attaching the coil transducer to the first and second lead frames such that the coil transducer extends horizontally between the first and second lead frames and the first and second ends extend onto or beneath at least portions of the first and second lead frames, no portions of the first and second lead frames are disposed vertically over or beneath any portions of the first and second coils, and the wire bond pads of the first and second coils are disposed vertically over or beneath the first and second lead frames, respectively, and
filling the gap substantially with at least one electrically non-conductive material having a voltage breakdown exceeding about 2,000 volts RMS.

32. The method of claim 31, further comprising encapsulating the coil transducer and at least portions of the first and second lead frames with a molding material comprising silica-loaded epoxy.

33. A method of making a coil isolator, comprising:
providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
providing a substrate having at least one aperture disposed therethrough, the aperture having at least one periphery;
providing a first integrated circuit (IC) and a first lead frame comprising a first IC die pad;
providing a second IC and a second lead frame comprising a second IC die pad;
attaching the first IC to the first IC pad and the second IC to the second IC pad;
attaching the coil transducer to the substrate such that the coil transducer extends horizontally across the aperture and at least portions of the first and second ends extend beyond the periphery and onto or beneath non-aperture portions of the substrate, non-aperture portions of the substrate are not disposed vertically over or beneath any portions of the first and second coils, and the wire bond pads of the first and second coils are disposed vertically over or beneath non-aperture portions of the substrate;
placing the first lead frame near the substrate such that the first lead frame and the substrate are separated by a first gap;
placing the second lead frame near the substrate such that the second lead frame and the substrate are separated by a second gap, and
filling the first and second gaps substantially with at least one electrically non-conductive material having a voltage breakdown exceeding about 2,000 volts RMS.

34. The method of claim 33, further comprising encapsulating the coil transducer, at least portions of the substrate, and at least portions of the first and second lead frames with a molding material comprising silica-loaded epoxy.

35. A method of making a coil isolator, comprising:
providing a coil transducer having opposing first and second ends and comprising a dielectric barrier having opposing first and second sides, the dielectric barrier comprising an electrically insulating, non-metallic, non-semiconductor, low-dielectric-loss material, a first electrically conductive transmitter coil disposed near or on the first side, first leads extending between the first coil and wire bond pads corresponding thereto, and a second electrically conductive receiver coil disposed near or on the second side, second leads extending between the second coil and wire bond pads corresponding thereto, the dielectric barrier being disposed between the first and second coils;
providing a first integrated circuit (IC) and a first lead frame comprising a first IC die pad;
providing a second IC and a second lead frame comprising a second IC die pad having at least one aperture disposed therethrough, the aperture having at least one periphery;
attaching the first IC to the first IC pad and the second IC to the second IC die pad;
attaching the coil transducer to the second lead frame such that the coil transducer extends horizontally across the aperture and at least portions of the first and second ends extend beyond the periphery and onto or beneath non-aperture portions of the second lead frame, non-aperture portions of the second lead frame are not disposed vertically over or beneath any portions of the first and second coils, and the wire bond pads of the first and second coils are disposed vertically over or beneath non-aperture portions of the second lead frame;

placing the first lead frame near the second lead frame such that the first lead frame and the second lead frame are separated by a gap, and filling the gap substantially with at least one electrically non-conductive material having a voltage breakdown exceeding about 2,000 volts RMS.

36. The method of claim 35, further comprising encapsulating the coil transducer, at least portions of the substrate, and at least portions of the first and second lead frames with a molding material comprising silica-loaded epoxy.

* * * * *